Jan. 1, 1974 E. M. CHESKIS ET AL 3,783,044

PHOTORESIST KEYS AND DEPTH INDICATOR

Filed April 9, 1971

INVENTORS

Eugene M. Cheskis
James B. Price

BY Mueller & Aichele

ATTY'S.

United States Patent Office 3,783,044

Patented Jan. 1, 1974

3,783,044

PHOTORESIST KEYS AND DEPTH INDICATOR

Eugene M. Cheskis, Scottsdale, and James B. Price, Phoenix, Ariz., assignors to Motorola, Inc., Franklin Park, Ill.

Filed Apr. 9, 1971, Ser. No. 132,798
Int. Cl. H01l 7/50, 7/00, 5/00
U.S. Cl. 148—175 3 Claims

ABSTRACT OF THE DISCLOSURE

A method is disclosed for providing means for orienting and positioning a photoresist mask on a semiconductor wafer and for indicating the depth of an epitaxial deposit. This means comprises filled holes called keys which are easily noted even though the surface of the wafer is carefully polished. Since the depth of the keys is less by a predetermined amount than the depth of the epitaxial deposit, presence of the keys after the polishing step indicates that the remaining depth of the deposit is great enough to make application of other process steps to the wafer advisable and the keys themselves are used for positioning and orienting such fixtures as masking devices on the surface of the wafer.

BACKGROUND

Figures 1, 2, 3, 4, 5, 6, 7, 8:
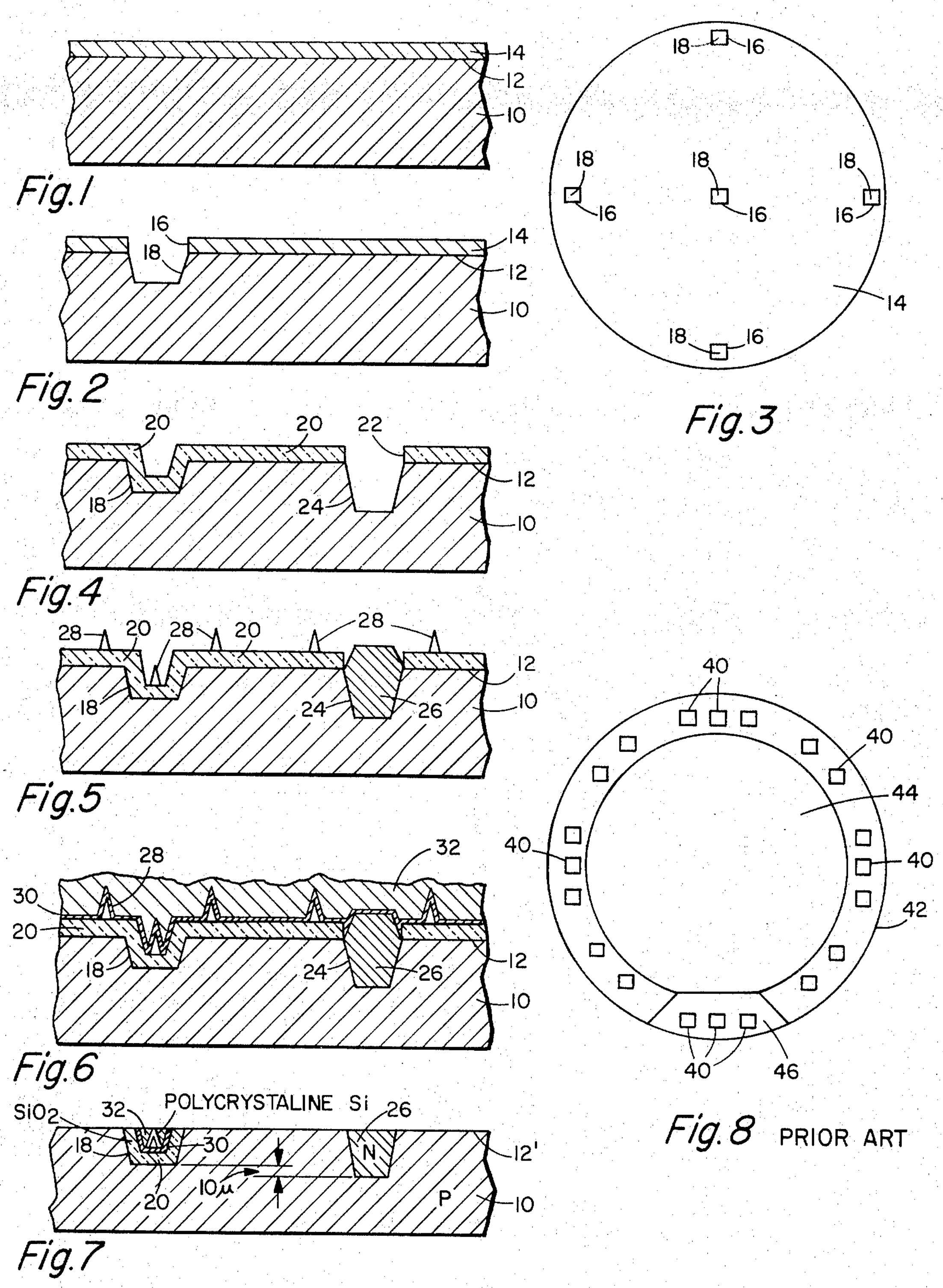
Fig. 1, Fig. 2, Fig. 3, Fig. 4, Fig. 5, Fig. 6, Fig. 7, Fig. 8 PRIOR ART

As related to this invention, in providing devices on a wafer, one starts with a planar polished semiconductive substrate or wafer, of P-type material for example, a surface of the substrate being coated with dielectric, the dielectric is then etched away in accordance with a pattern and the wafer itself is etched to produce holes part way thereinto and material of a resistivity and/or type different than the original substrate is deposited in the holes by epitaxial deposition. Then the surface of the wafer having the epitaxial islands therein and a layer of dielectric surrounding the islands is processed and polished to produce a planar surface of the substrate with the surface of the islands flush with the surface of the substrate. For further processing, diffusions or deposits must be made which are carefully oriented and positioned with respect to the islands. The epitaxial islands are very difficult to see since they present very little visual contrast with the remainder of the surface of the substrate. Also, the islands, for further processing to have any value, must have a minimum thickness after the substrate is polished. It is imposisble to measure the thickness of the islands by breaking the substrate or by cutting it at an angle and staining the broken or bevelled substrate with a stain that provides contrast between the islands and the original material of the substrate. The slight difference in visual contrast between the islands and the substrates makes proper positioning of fixtures on the substrate very difficult and the breaking or bevelling of the wafer to determine the thickness of the islands is wasteful of time and material.

It is an object of this invention to provide improved orienting or positioning means on a semiconductor wafer as well as epitaxial island depth indicators.

It is another object of this invention to provide an improved orienting or positioning means for a semiconductive wafer combined with improved means for indicating the depth of the islands of semiconductive material that have been deposited in holes in the surface of the wafer.

SUMMARY

In accordance with this invention, key holes are etched in the polished surface of a wafer of semiconductive material of one conductivity type, the holes being of a certain depth and then the whole surface of the wafer including the inside of the key holes is covered with dielectric. Then further or deposits holes are etched into the wafer, the depth of the further holes being greater by a desired amount than the depth of the key holes. Then semiconductive material of the other conductivity type and/or a different resistivity is deposited in the other or deposit holes, epitaxially for example, and then the key holes are filled with polycrystalline material and then the surface of the wafer is cut away and polished to the point where the dielectric layer and the polycrystalline material, except that which is in the key holes, has been removed and the resultant surface of the wafer is smooth and planar and polished. Thus the dielectric in the key holes, as well as imperfections in the polycrystalline material in the key holes, will readily be visible whereby the key holes can be used for orienting any fixture such as masks that may be used or found necessary for the further processing of the wafer, and the fact that the key holes are still visible indicates that the thickness of the material in the deposit holes is at least equal to the difference in depth between the key holes and the other deposit holes, whereby it is known that other operations on the wafer whose usefulness depends on the minimum depth of the material in the other holes, would not be wasted.

DESCRIPTION

The invention will be better understood upon reading the following description in connection with the accompanying drawing in which FIGS. 1 to 7 illustrate the method of this invention and FIG. 8 is useful to illustrate advantages of the present invention.

In accordance with this invention, a wafer or substrate 10 of semiconductor material (for example P-type silicon) which has a planar polished upper surface 12 is provided and a layer of dielectric 14 (for example $SiO_2$) is provided on the surface 12, as shown in FIG. 1. Then, as shown in FIG. 2, a key hole 18 is provided in the surface 12 of the wafer 10 by providing the holes 16 in the layer 14 in a known manner as by selective etching and then by etching the key hole 18 to a desired length. As shown in FIG. 3, which is a plan view, only a small number of key holes 18 need be provided, although one may provide as many thereof as is desired. Then the layer 14 is removed in any known manner and another layer 20 of refractory material which may be $SiO_2$ is provided on the surface 12, FIG. 4, this layer 20 extending down into the key hole 18 and covering the inside thereof. Normally, the thickness of the layer 20 is not sufficient to fill the key hole 18. Then, as many holes 22 are cut into the layer 20 as is desired, as by patterned etching. Then the deposit hole 24 is cut into the substrate 10 to a depth greater than the depth of the hole 18 by an amount dependent upon device parameters. Then, by epitaxial deposition, the deposit hole 24 is filled with material 26 of a different type and/or resistivity and usually a mound thereof extends above the surface 12. Also, little spikes 28 of crystalline silicon will appear on the surface of the layer 20 both inside and outside the hole 18 in a random manner. However, the hole 18 which is partially filled with $SiO_2$ material 20 may not fill up during this step. To fill the holes 18, a very thin layer about 0.1 micron thick of chemically deposited $SiO_2$ 30 is deposited on the $SiO_2$ layer 20. Then a layer of polycrystalline silicon 32 is deposited on the $SiO_2$ 30 as by the method disclosed in an application of James B. Price and William C. Roman, Ser. No. 97,811 filed Dec. 14, 1970, now U.S. Pat. No. 3,734,770. This polycrystalline silicon will provide a rough surface as shown but the holes 18 will be filled up and the layer 32 will cover more or less uniformly the layer 30 and including the spikes 28. Then, as shown in FIG. 7, the upper surface of the substrate 10 is cut and polished to about the surface 12 (not shown in FIG. 7) or enough therebelow, to provide a smooth polished planar surface 12'. Since the edges of the $SiO_2$ layer 20 extend through the surface 12' and since $SiO_2$ of the layers 20 and 30 is visually distinct from the P-type silicon wafer 10, the outline of the key hole 18 will be visible. If any spikes 28 grow in the hole 18, as shown in FIG. 5, and if the top of the spike 28 is cut off to produce the device of FIG. 7, the presence of the spikes will be shown by a little circle inside the rectangular outline in the key area, making the key area more easily detected.

While only one hole 24 and only one island of epitaxial deposited silicon are shown in FIGS. 4 to 7, there may be a great many thereof, as many as are necessary to provide the circuit chips into which the wafer 10 will be broken. That is, while about five keys 18 will be provided, several hundred epitaxial deposited islands 26 will be provided on one wafer 10.

FIG. 8, which is also a plan view, is referred to as illustrating the advantages of the present invention over the prior art. Many hundreds of islands 40 are deposited in holes in the wafer 42 in rows and columns. The central portion 44 of the wafer 42 is covered with oxide and the islands 40 on the edge of the wafer are visible for orienting and locating a fixture such as a mask so when a fixture is located by using an island 40 on one side of the oxidized area 44 with another island on the other side of the oxidized area 44, in the first place the islands are hard to see and secondly, it is difficult to determine if the two islands on the opposite sides of the oxidized area are in the same row, whereby the mask that is located by reference to the islands that are not in the same row are tilted, whereby further operations on the wafer destroy it. In contrast thereto, according to this invention, the keys 18 are quite visible and there are only a few of them placed in known space relationship to each other whereby the fixture cannot be improperly positioned. Also, according to the prior art, a portion of the wafer 42 is bevelled as at 46 to determine if the thicknesses of the islands 40 are great enough so that properly operating semi-conductor devices can be made on the remainder of the wafer 42. This is not necessary in accordance with this invention, since the keys 18 being visible, the thickness of the islands 26 is great enough for further processing of the wafer.

What is claimed is:

1. A method of producing a key for locating a fixture with respect to a semiconductor wafer of a first conductivity type and for showing the depth of islands deposited in holes in the wafer which consist of:

etching at least one key hole in the surface of said wafer, said key hole having a given depth;

coating the said surface of said wafer and the inside of said key hole with a layer of insulating oxide;

etching at least one deposit hole in each said surface of said wafer, the depth of said deposit hole being greater than the depth of said key hole by the predetermined amount;

depositing a semiconductor of the opposite conductivity type in said deposit hole to at least fill said hole;

depositing a second layer of insulating oxide on said surface;

depositing a layer of polycrystalline semiconductor material on said semiconductor wafer to fill said key hole; and lapping said material at its above said surface of said wafer thereby to provide a surface which shows the outlines of said key hole.

2. The invention of claim 1 in which said surface of said wafer from which said layers have been removed is polished.

3. The invention of claim 1 in which said surface of said wafer is polished to a point where the outline of the key holes are visible.

References Cited

UNITED STATES PATENTS

| | | | |
|---|---|---|---|
| 3,428,499 | 2/1969 | Cullis | 148—175 X |
| 3,623,218 | 11/1971 | Mitarai et al. | 156—17 X |
| 3,243,323 | 3/1966 | Corrigan et al. | 148—175 |
| 3,363,151 | 1/1968 | Chopra | 317—235 X |
| 3,397,448 | 8/1968 | Tucker | 29—580 X |
| 3,419,956 | 1/1969 | Kren et al. | 29—580 X |
| 3,411,200 | 11/1968 | Formigoni | 29—580 |
| 3,500,139 | 3/1970 | Frouin et al. | 317—235 |
| 3,624,463 | 11/1971 | Davidsohn | 317—234 |

OTHER REFERENCES

Levenberger et al.: "Complementary-MOS Low-Power . . . Counter" Proc. IEEE, vol. 57, No. 9, September 1969, pp. 1528–1532.

Rosvold et al.: "Air-Gap Isolated . . . Beam-Lead Devices" IEEE Trans. on Electron Dev., vol. ED–15, No. 9, September 1968, pp. 640–644.

CHARLES N. LOVELL, Primary Examiner

W. G. SABA, Assistant Examiner

29—580, 583; 148—1.5, 174; 156—11, 17; 317—235 R